US008368114B2

(12) United States Patent
Yang

(10) Patent No.: US 8,368,114 B2
(45) Date of Patent: Feb. 5, 2013

(54) FLIP CHIP LED DIE AND ARRAY THEREOF

(75) Inventor: Chiu-Chung Yang, Taichung (TW)

(73) Assignee: Chiuchung Yang, Taichung (TW)

( * ) Notice: Subject to any disclaimer, the term of this patent is extended or adjusted under 35 U.S.C. 154(b) by 231 days.

(21) Appl. No.: 12/943,020

(22) Filed: Nov. 10, 2010

(65) Prior Publication Data

US 2011/0049538 A1 Mar. 3, 2011

Related U.S. Application Data

(63) Continuation-in-part of application No. 11/791,159, filed on May 18, 2007, now Pat. No. 8,143,641.

(30) Foreign Application Priority Data

Jun. 10, 2010 (TW) ............................... 99118922 A

(51) Int. Cl.
*H01L 29/24* (2006.01)

(52) U.S. Cl. ...... 257/100; 257/99; 257/98; 257/E33.059

(58) Field of Classification Search ............ 257/88–100, 257/E33.005, E33.006, E33.002, E33.056, 257/E33.057, E33.058, E33.059, E33.065
See application file for complete search history.

(56) References Cited

U.S. PATENT DOCUMENTS 6,622,746 B2 * 9/2003 Yang et al. ........................ 137/4
7,589,351 B2 * 9/2009 Hsieh .............................. 257/79
7,622,746 B1 * 11/2009 Lester et al. .................... 257/98
7,691,659 B2 * 4/2010 Bader et al. ..................... 438/47
2005/0056831 A1 * 3/2005 Senda et al. .................... 257/40
2007/0023769 A1 * 2/2007 Nishimoto et al. ............. 257/88
2007/0262338 A1 * 11/2007 Higashi et al. ................. 257/99
2009/0121241 A1 * 5/2009 Keller et al. .................... 257/96
2010/0230711 A1 * 9/2010 Kuo et al. ....................... 257/99
2010/0320488 A1 * 12/2010 Horie ............................. 257/91
2011/0266560 A1 * 11/2011 Yao et al. ....................... 257/88

* cited by examiner

*Primary Examiner* — Robert J Hoffberg
*Assistant Examiner* — Ali Naraghi
(74) *Attorney, Agent, or Firm* — CKC & Partners Co., Ltd.

(57) ABSTRACT

A flip chip LED die is provided and includes a first type doped layer, a second type doped layer, a first electrode layer, a second electrode layer and an insulation layer. The second type doped layer is disposed under the first type doped layer. The first electrode layer is disposed under the first type doped layer without contacting the second type doped layer. The first electrode layer has an exposed area for directly coating an electrically conductive adhesive thereon. The second metal/electrode layer is disposed under the second type doped layer, and also has an exposed area for directly coating the electrically conductive adhesive thereon. The insulation layer is disposed between the first electrode layer and the second electrode layer for electrically insulating and supporting the first electrode layer and the second electrode layer.

10 Claims, 8 Drawing Sheets

301
302
303
306
306
304
305
320

FLIP CHIP LED DIE AND ARRAY THEREOF

RELATED APPLICATIONS

This application is a continuation in part of U.S. patent application Ser. No. 11/791,159, filed on May 18, 2007. This application also claims priority to Taiwan Patent Application Serial Number 99118922, filed on Jun. 10, 2010. The entire disclosures of both applications are hereby incorporated by reference herein.

BACKGROUND

1. Technical Field

The present disclosure relates to a LED (Light Emitting diode). More particularly, the present disclosure relates to a flip chip LED.

2. Description of Related Art

Referring to FIG. 1, FIG. 1 is a flow chart showing the steps of a conventional flip chip LED packaging process. The conventional flip chip LED packaging process includes at least seven steps. At first, as shown in step 101, many dies 110 on a wafer are taken out by using a wafer expanding technique. Thereafter, as shown in step 102, a first robot arm 210 and its vacuum sucker 211 are used to pick up the die 110; as shown in step 103 and step 104, the first robot arm 210 turns the die 110 over and hands in to a second robot arm 220 and its vacuum sucker 221. Certainly, another feasible method may adopt a flipping technique using a blue tape to enable the above process. Then, as shown in step 105, bumps 111 on the die 110 are precisely positioned at conductive contacts 121 located on a flip-chip substrate 120. Thereafter, as shown in step 106, the bumps 111 are heated by microwave so as to electrically connecting the die 110 to a flip-chip substrate 120. Then, as shown in step 107, the gap between the die 110 and the flip-chip substrate 120 is sealed by using a spot gluing technique, and thus the encapsulation of a chip 130 is completed. Besides, the chip 130 generally needs one baking step to cure the material filled during spot gluing, and thus the chip 130 may become an end product which can be directly utilized. When being utilized, the chip 130 is electrically connected to circuits on a circuit board by using a conductive structure predetermined on the flip-chip substrate 120.

SUMMARY

Hence, an aspect of the disclosure is to provide a flip chip LED die for omitting a chip packaging process.

According to one embodiment of the disclosure, a flip chip LED die is provided. The flip chip LED die includes a first type doped layer, a second type doped layer, a first electrode layer, a second electrode layer and an insulation layer. The second type doped layer is disposed under the first type doped layer, and the first electrode layer is disposed under the first type doped layer without contacting the second type doped layer, and has an exposed area on which an electrically conductive adhesive is allowed to be directly coated. The second electrode layer is disposed under the second type doped layer, and has a second exposed area on which the electrically conductive adhesive is allowed to be directly coated. The insulation layer is disposed between the first electrode layer and the second electrode layer for electrically insulating and supporting the first electrode layer and the second electrode layer.

According to another aspect of the disclosure, a flip chip LED array is provided and includes many aforementioned flip chip LED dies and a metal pattern layer. The metal pattern layer is used for performing a selective electrical connection on the first electrode layer and the second electrode layer of each flip chip LED die so as to connect the flip chip LED dies in series or in parallel.

It is worthy to be noted that, in another embodiments, when the electrically conductive adhesive is silver glue, each of the aforementioned exposed areas is of at least 625 $\mu m^2$ for directly coating the silver glue thereon; and, when the electrically conductive adhesive is solder paste, each of the aforementioned exposed areas is of at least 10000 $\mu m^2$ for directly coating the silver glue thereon. Further, on the detailed structure of the flip chip LED die, a metal reflection layer can be further disposed between the second type doped layer and the second electrode layer, and a Bragg reflector structure can be further disposed between the metal reflection layer and the second type doped layer, and a transparent coating layer can be further disposed on top of the first type doped layer. Additionally, a coarsened structure can be further designed and disposed on an outer surface of the transparent coating layer, and on a side surface of the transparent coating layer. Besides, the transparent coating layer can be a patterned sapphire substrate.

Hence, the aforementioned embodiments regarding the flip chip LED die and the flip chip LED array obtain a complete product which can be directly used during a wafer fabrication process, thereby omitting all of the steps of the conventional flip chip LED packaging process, thus making a lot of progress in the aspects of equipment, cost and time consumption.

DETAILED DESCRIPTION

When the flip chip packaging technique was presented, it is mainly used to overcome the problem of electrical oversensitivity for a conventional logic operation chip. For example, when a conventional logic operation die is packaged into a chip, wire-bonding is required, but the wire-bonding will generate additional electrical inductance effect, and thus the flip chip packaging technique was provided to replace the wire-bonding with a flip-chip substrate. However, such a technique has become a stereotype and is continuously applied on the fabrication of a flip chip LED chip. The present disclosure is based on years of practical experience and long-term observation and efforts to research the aforementioned stereotype accompanying with various features of the LED different from the logic operation chip, thereby overcoming the shortcomings of the conventional skill.

Figure 1:
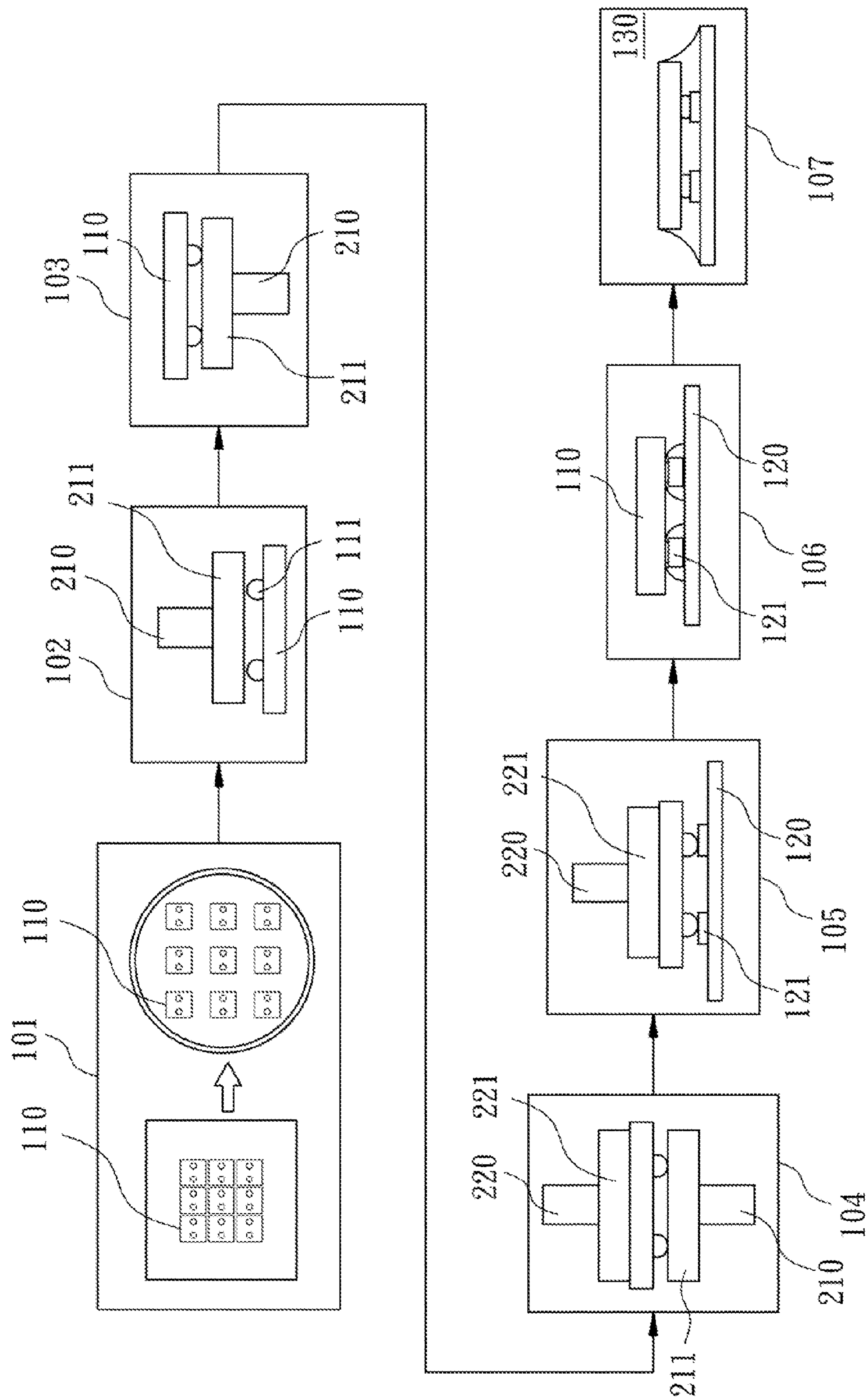
FIG. 1 is a flow chart showing the steps of a conventional flip chip LED packaging process.
Figure 2:
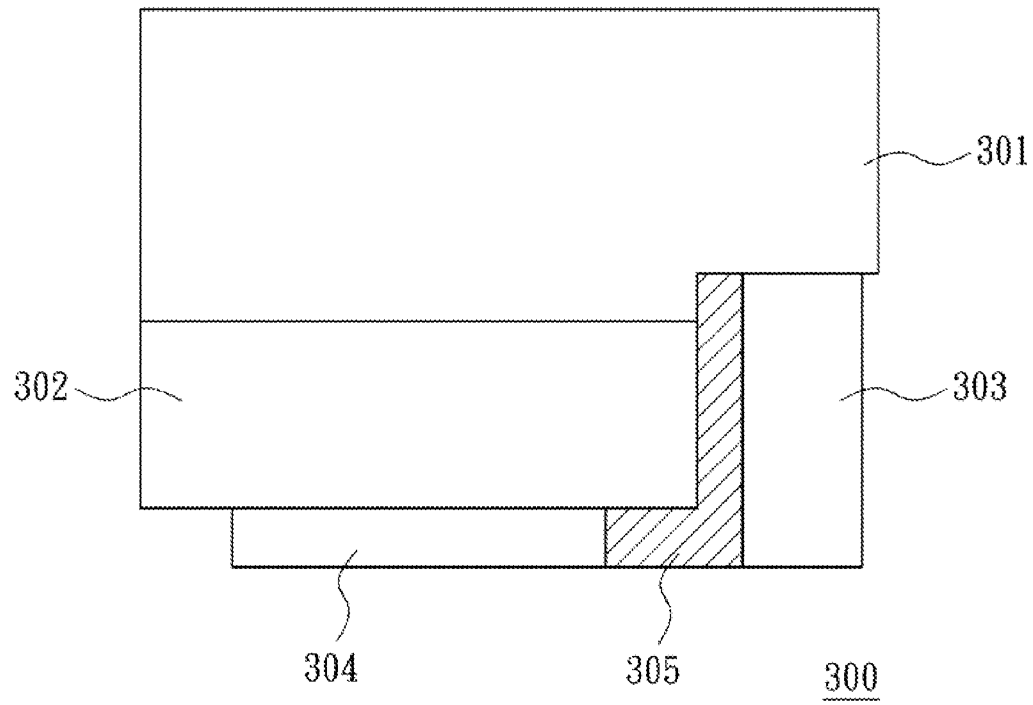
FIG. 2 is a schematic view showing the structure of a flip chip LED die according to one embodiment of the disclosure.

Referring FIG. 2, FIG. 2 is a schematic view showing the structure of a flip chip LED die according to one embodiment of the disclosure. In FIG. 2, a flip chip LED die 300 of this embodiment includes a first type doped layer 301, a second type doped layer 302, a first electrode layer 303, a second electrode layer 304 and an insulation layer 305. The second type doped layer 302 is disposed under the first type doped layer 301, and the first electrode layer 303 is disposed under the first type doped layer 301 without contacting the second type doped layer 302, and has an exposed area on which an electrically conductive adhesive is allowed to be directly coated. The second electrode layer 304 is disposed under the second type doped layer 302, and has a second exposed area on which the electrically conductive adhesive is allowed to be directly coated. The insulation layer 305 is disposed between the first electrode layer 303 and the second electrode layer 304 for electrically insulating and supporting the first electrode layer 303 and the second electrode layer 304.

In order to implement a striped upright first electrode layer 303 for using its side surfaces to increase the overall exposed area on which the electrical adhesive is allowed to be directly coated, this embodiment uses the insulation layer 305 to support the first electrode layer 303, such that peeling will not occur during the process for fabricating the first electrode layer 303, and the first electrode layer 303 will be more robust when becoming an end product, such that a short circuit will not be caused since the first electrode layer 303 will not be bent, by external force, to contact the second electrode layer 304. On the other hand, when the first electrode layer 303 and the second electrode layer 304 both have quite large volumes, an electrical arc may occur therebetween to cause a short circuit. Therefore, the insulation layer 305 can be used to isolate the first electrode layer 103 from the second electrode layer 304 so as to prevent the short circuit. Besides, although capacitance effects definitely will occur among the insulation layer 305, the first electrode layer 303 from the second electrode layer 304, yet those effects do not damage the flip chip LED die 300 of which the purpose is to emit light. On the contrary, the first electrode layer 303 and the second electrode layer 304 with respective large exposed areas are advantageous for heat dissipation, thereby resisting the problem of light attenuation which is truly cared by the LED.

It is worthy to be noted that, if the electrically conductive adhesive is silver glue, each of the aforementioned exposed areas of the first electrode layer 303 and the second electrode layer 304 is of at least 25 μm×25 μm for directly coating the silver glue thereon; and, when the electrically conductive adhesive is solder paste, each of the aforementioned exposed areas of the first electrode layer 303 and the second electrode layer 304 is of at least 100 μm×100 μm for directly coating the silver glue thereon. Further, the first type doped layer 301 can be a p-type semiconductor layer, and the second type doped layer 302 can be a n-type semiconductor layer, and vice versa. The material forming the semiconductor layers can be such as aluminum gallium arsenide (AlGaAs), gallium arsenic phosphide (GaAsP), gallium phosphide (GaP), aluminum gallium indium phosphide (AlGaInP), indium gallium nitride (InGaN), gallium nitride (GaN), zinc selenide (ZnSe), silicon carbide (SiC), etc.

Figure 3A:
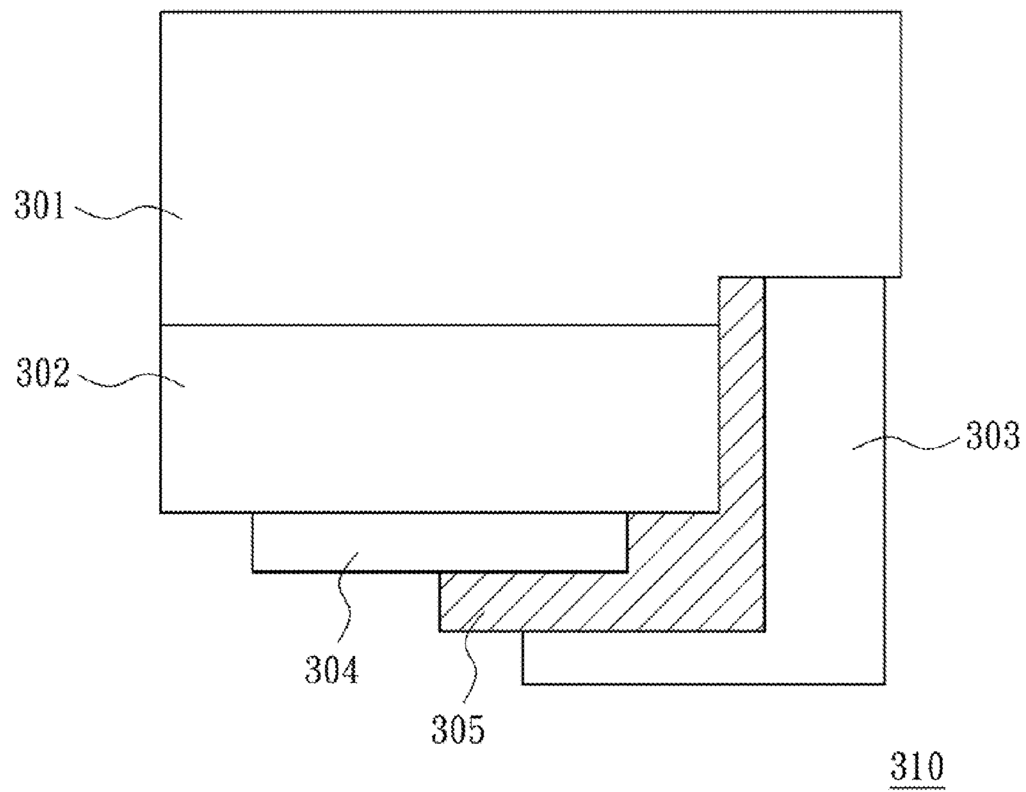
FIG. 3A is a schematic view showing the structure of a flip chip LED die according to another embodiment of the disclosure.
Figure 3B:
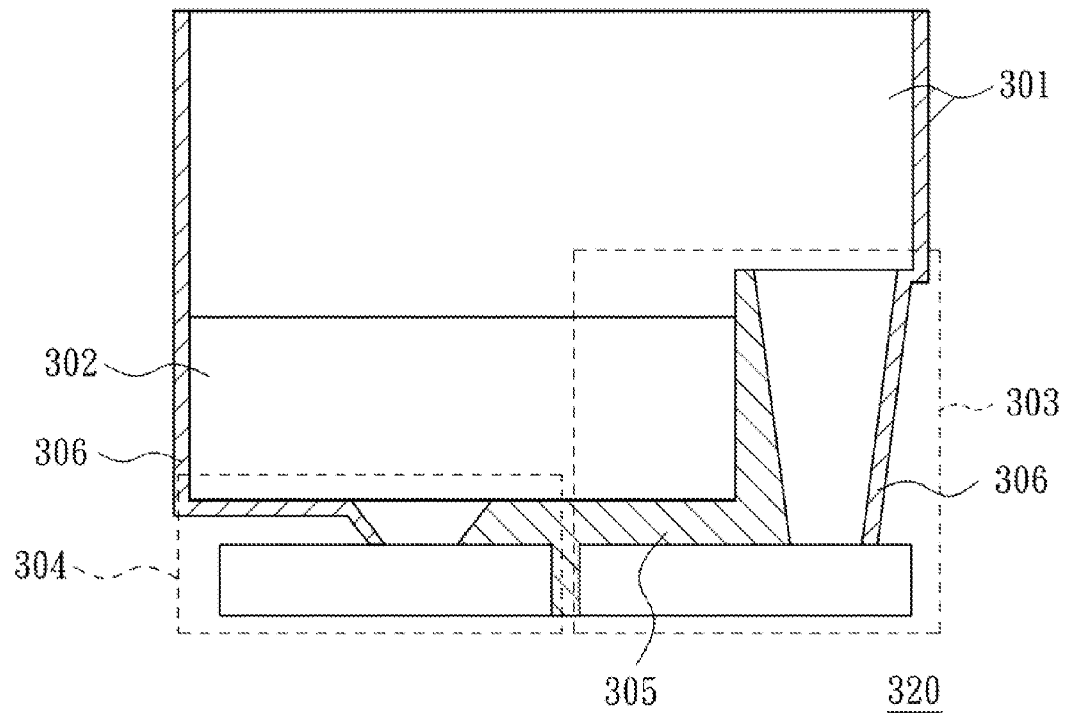
FIG. 3B is a schematic view showing the structure of a flip chip LED die according to another embodiment of the disclosure.
Figure 3C:
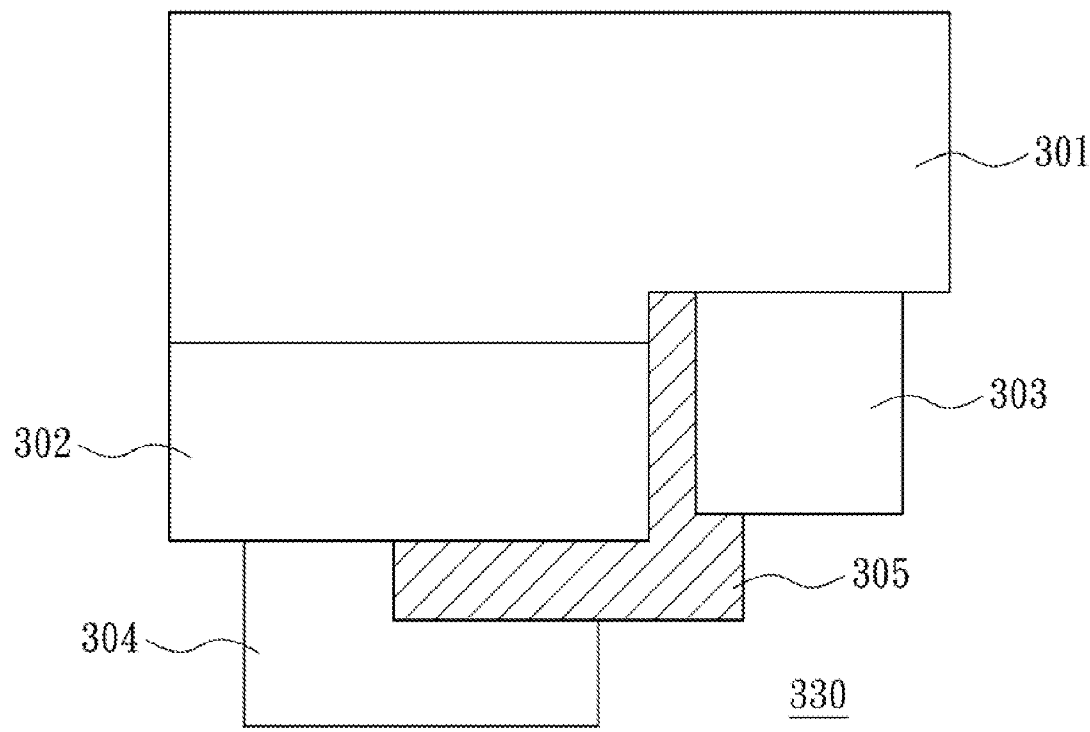
FIG. 3C is a schematic view showing the structure of a flip chip LED die according to another embodiment of the disclosure.

Referring to FIG. 3A, FIG. 3B and FIG. 3C, they are schematic views showing the structures of flip chip LED dies according to three embodiments of the disclosure. These three embodiments all implement on a die a large electrode structure which can be directly utilized, thereby omitting a back-end process of packaging the conventional die into a chip. In FIG. 3A, the second electrode 304 can be largely disposed on the second doped layer 302. When the applicable side surface of the first electrode layer 303 may not have a sufficient area to directly dispense the electrical adhesive thereon, the insulation layer 305 may cover a portion of the second electrode 304, and then the first electrode layer 303 is coated on the insulation layer 305 towards the second electrode layer 304. In FIG. 3B, the first electrode layer 303 and the second electrode layer 304 both can be performed with a two-stage fabrication. That is, two metal layers are respectively formed on the first type doped layer 303 and the second type doped layer 304 by using a conventional process, and additional wafer fabrication steps are used to form the insulation layer 305 and two large electrodes on the two metal layers, thereby respectively completing the first electrode layer 303 and the second electrode layer 304. In FIG. 3C, if it is afraid that the first electrode layer 303 is located too close to the second electrode layer 304 for possibly resulting in a short circuit, the insulation layer 305 can be used to increase the distance between the first electrode layer 303 and the second electrode layer 304.

It is worthy to be noted that, in FIG. 3B, a flip chip LED die 320 further includes a protection layer 306, wherein the protection layer 306 is an insulation film formed from an insulation material for generating a film-protection function, thereby increasing the operational life of the flip-chip LED die 300. During the process, the protection layer 306 can be formed on a front surface or side surface by using spin coating or E-gun.

In view of the above, the flip chip LED dies 310, 320 and 330, shown in FIG. 3A, FIG. 3B and FIG. 3C, all form the first electrode 303 and the second electrode 304 used as the positive and negative electrodes during the wafer fabrication process, such as the steps of depositing, exposure, development, etching, etc. Then, after a dicing step, the flip chip LED die can be independently applied is obtained. In other words, the equipment required for the conventional flip chip techniques including wafer expanding, flipping, transposing, microwaving, spot gluing and baking, can be saved. Besides, the time for performing the conventional flip chip LED techniques including wafer expanding, flipping, bumping, chip and substrate bonding, glue filling and baking also can be saved.

Figure 4:
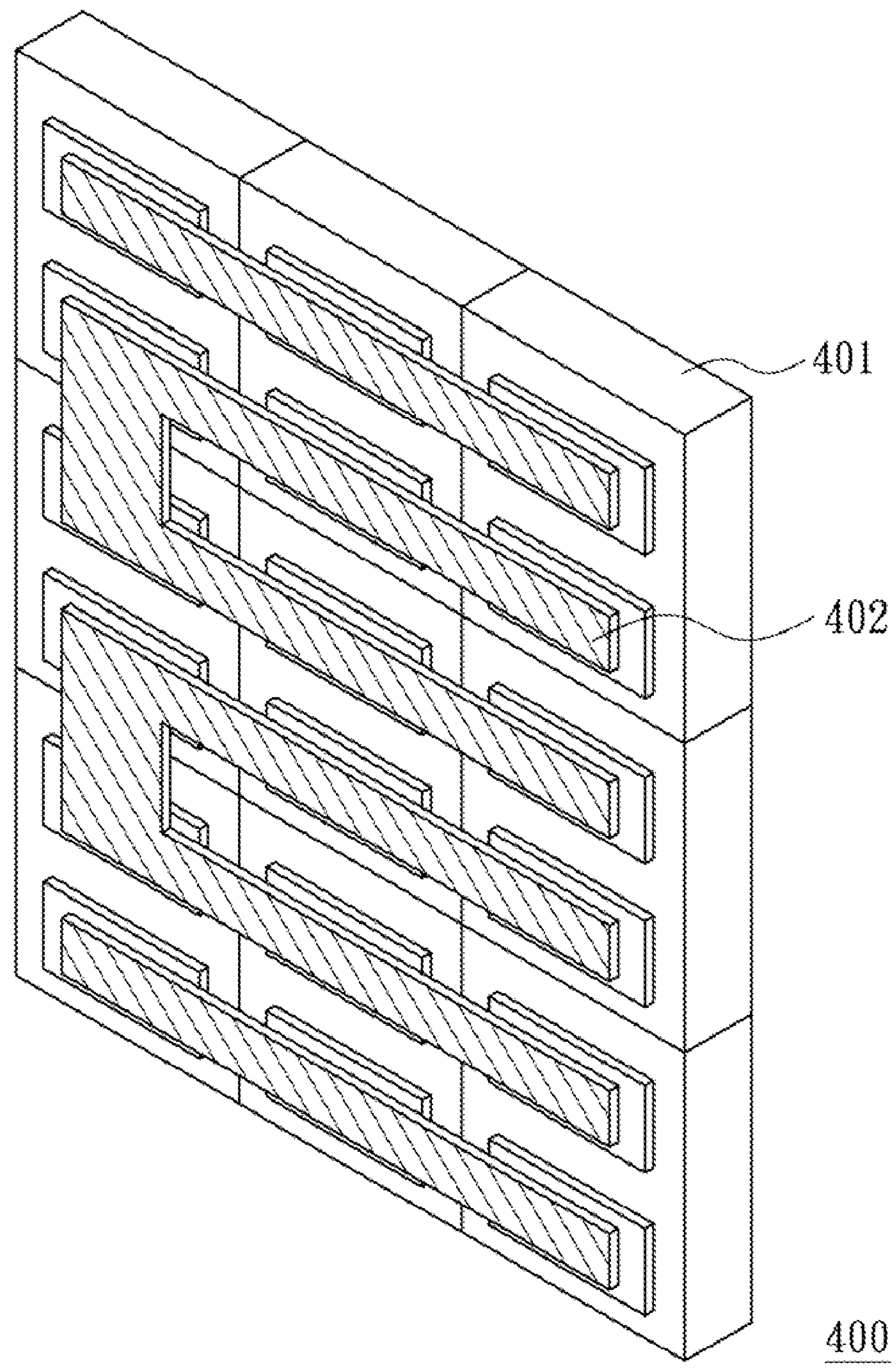
FIG. 4 is a schematic view showing the structure of a flip chip LED array according to one embodiment of the disclosure.

Referring to FIG. 4, FIG. 4 is a schematic view showing the structure of a flip chip LED array according to one embodiment of the disclosure. In FIG. 4, a flip chip LED array 400 of this embodiment, a metal layer fabrication skill is applied at a final stage of the aforementioned wafer process to form a metal pattern layer 402 crossing dies 401, thereby connecting many dies 401 in series and parallel. Then, the respective dies do not need to be diced and separated, and are applied in terms of an array in accordance with the number of dies defined by their metal pattern layers 402. Consequently, several LED dies 401 have completed their series-parallel structure at the wafer fabrication level, and further can be directly electrically connected to an AC or DC source. In contrast, in the conventional flip chip LED, each of the dies has to be packaged into a chip by using a flip-chip substrate, and then an additional circuit board is used to electrically connect the chips in series and parallel.

Figure 5:
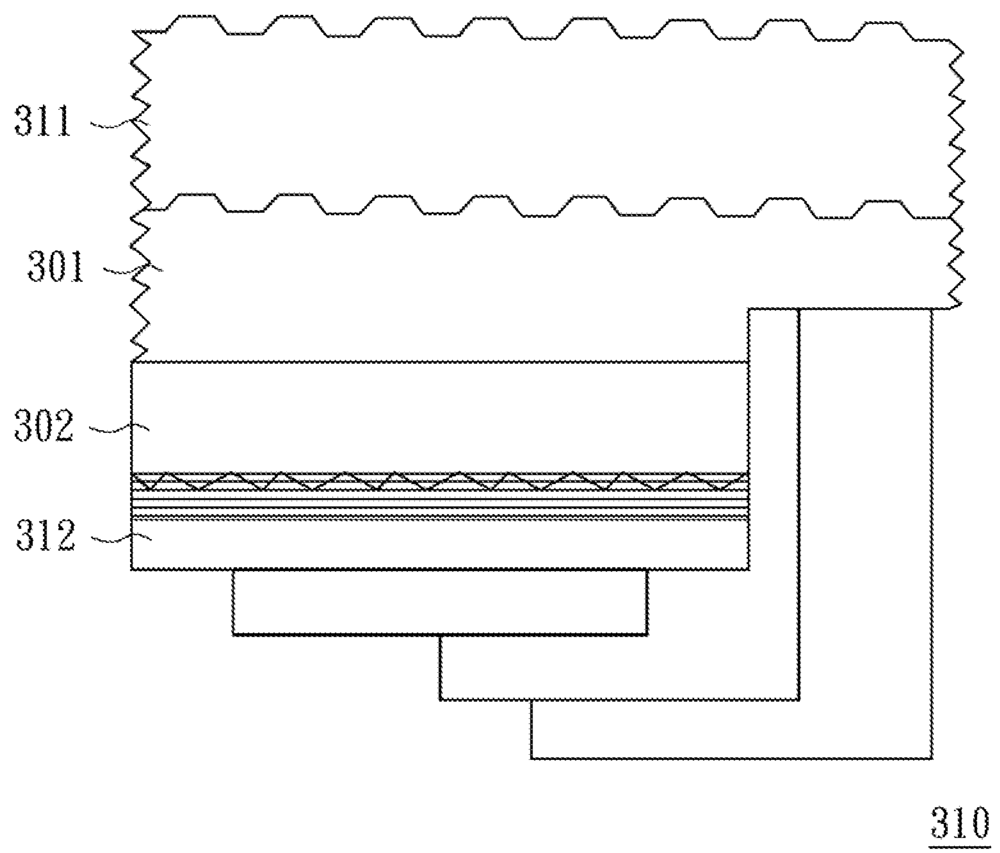
FIG. 5 is a schematic view showing the detailed structure of the flip chip LED die shown in FIG. 3A.

Hereinafter, referring to FIG. 5, FIG. 5 is a schematic view showing the detailed structure of the flip chip LED die shown in FIG. 3A. In order to promote the light emitting efficiency of the flip chip LED die 310, on the detailed structure of the flip chip LED die 310, a transparent coating layer 311 is further disposed on top of the first type doping layer 301, and a metal reflection layer 312 is further disposed between the second type doped layer 302 and the second electrode layer. The metal reflection layer 312 is disposed under a PN junction which actually emits light, and can be used for reflecting the light emitted downwards back to the transparent layer 311, i.e. to the light emitting side of the whole flip chip LED die 310. Further, another reflective surface also can be designed on a circuit board to which the flip chip LED die 310 is attached for reflecting the light emitted downwards from the PN junction.

Figure 6:
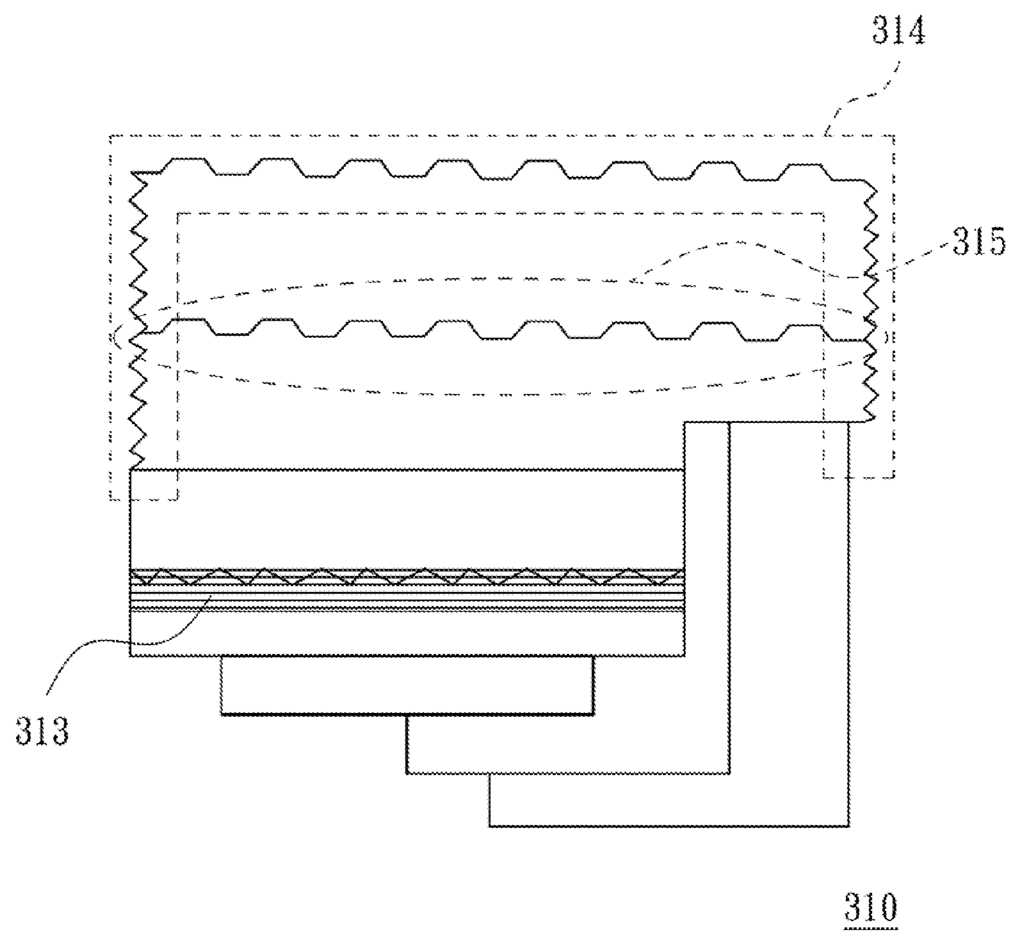
FIG. 6 is a schematic view showing the detailed structure of the flip chip LED die shown in FIG. 3A.

Referring to FIG. 6, FIG. 6 is a schematic view showing the detailed structure of the flip chip LED die shown in FIG. 3A. In FIG. 6, a Bragg reflector structure 313 can be further disposed between the metal reflection layer and the second type doped layer, wherein the Bragg reflector structure 313 is formed by alternately arranging more than two materials of different dielectric constants, and the thickness of each layer of the materials is designed as one quarter of the wavelength of light, thereby constructing a quarter-wave-stack multi-layered system, which is equivalent to a simple one-dimensional photonic crystal. Consequently, since the electromagnetic wave of which the frequency falls within an energy gap cannot penetrate through the Bragg reflector structure, the reflectivity of the Bragg reflector structure can reach above 99%. The Bragg reflector structure does not have the absorption problem occurring in a common metal reflector mirror, and also can adjust the position of energy gap by changing the refractive index of the material.

On the other hand, on an upper surface of the transparent coating layer, i.e. the back-side light emitting surface of the flip chip LED die 310, a coarsened structure 314 can be further designed and disposed. Similarly, the coarsened structure 314 can be disposed on the side surfaces surrounding the transparent coating layer and the first type doped layer. The design principle of the coarsened structure 314 is described as follows.

Generally speaking, the angle of total reflection by air is about 24.5 degrees. A LED chip is generally diced in a rectangular shape, and about 8% of the light can emitted out of the die, and about 92% of the die is confined inside the die and transformed to heat. Destroying the angle of total reflection can promote the light emitting efficiency of the LED, and thus a coarsening step performed on the surface of the die can obtain the effect of promoting light-emitting efficiency. It is noted that the degree of coarsening on the LED surface has to be greater that twice of the light wavelength so as to have an apparent light-emitting efficiency. Nonrectangular die profiles or fine nonrectangular cuttings inside the die also can promote light-emitting efficiency.

Further, the material of the transparent coating layer can be a sapphire ($Al_2O_3$) substrate, gallium phosphide (GaP), silicon resin, glass or Teflon. Considering the manufacturing process, the aforementioned metal reflection layer and the second electrode layer can be simultaneously formed in the same process.

In sum, the flip chip LED of this embodiment can omit using a soldering machine (costs about $120,000) or a flip-chip bumping machine (costs about $600,000), a SMT (Surface Mounting Technology) machine, etc. and further can save the expense of consumable materials and flip-chip substrates, thus apparently saving the fabrication cost and promoting the throughput.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A flip chip LED (Light Emitting Diode) die being ready-to-use without package, comprising: a first type doped layer having a top surface; a second type doped layer disposed under the first type doped layer; a first electrode layer disposed under the first type doped layer without contacting the second type doped layer, the first electrode layer having a first exposed area on which an electrically conductive adhesive is allowed to be directly coated; a second electrode layer disposed under the second type doped layer, the second electrode layer having a second exposed area on which the electrically conductive adhesive is allowed to be directly coated; an insulation layer disposed between the first electrode layer and the second electrode layer for electrically insulating and supporting the first electrode layer and the second electrode layer; and a protection film formed by an insulation material and disposed over all surfaces of the flip chip LED die except for the top surface, the first exposed area, the second exposed area, and a bottom surface of the insulation layer between the first exposed area and the second exposed area; wherein each of the first electrode layer and the second electrode layer has a rectangular cross section with a single inner vertical surface or an L-shaped cross section with first and second inner vertical surfaces, and the second type doped layer has a rectangular cross section with a single inner vertical surface; wherein the insulation layer is in direct contact with the entire inner vertical surface of the second type doped layer, is in direct contact with the entire inner vertical surface of each of the first electrode layer and the second electrode layer when each of the first electrode layer and the second electrode layer has a rectangular cross section, and is in direct contact with one of the first or second inner vertical surfaces of each of the first electrode layer and the second electrode layer when each of the first electrode layer and the second electrode layer has an L-shaped cross section; wherein the first exposed area of the first electrode layer, the second exposed area of the second electrode layer, and the bottom surface of the insulation layer are appeared as viewing from the bottom of the flip chip LED die; and wherein the first electrode layer, the insulation layer, and the protection film on each of the first type doped layer, the second type doped layer and the second electrode layer are appeared as viewing from a first side vertical to the top surface of the flip chip LED die, and the protection film on each of the first type doped layer and the first electrode layer is appeared as viewing from a second side opposite to the first surface of the flip chip LED die.

2. a first type doped layer having a top surface;

a second type doped layer disposed under the first type doped layer; a first electrode layer disposed under the first type doped layer without contacting the second type doped layer, the first electrode layer having a first exposed area on which an electrically conductive adhesive is allowed to be directly coated; a second electrode layer disposed under the second type doped layer, the second electrode layer having a second exposed area on which the electrically conductive adhesive is allowed to be directly coated; an insulation layer disposed between the first electrode layer and the second electrode layer for electrically insulating and supporting the first electrode layer and the second electrode layer; and a protection film formed by an insulation material and disposed over all surfaces of the flip chip LED die except for the top surface, the first exposed area, the second exposed area, and a bottom surface of the insulation layer between the first exposed area and the second exposed area; wherein each of the first electrode layer and the second electrode layer has-a rectangular cross section with a single inner vertical surface or an L-shaped cross section with first and second inner vertical surfaces, and the second type doped layer has a rectangular cross section with a single inner vertical surface; wherein the insulation layer is in direct contact with the entire inner vertical surface of the second type doped layer, is in direct contact with the entire inner vertical surface of each of the first electrode layer and the second electrode layer when each of the first electrode layer and the second electrode layer has a rectangular cross section, and is in direct contact with one of the first or second inner vertical surfaces of each of the first electrode layer and the second electrode layer when each of the first electrode layer and the second electrode layer has an L-shaped cross section; wherein the first exposed area of the first electrode layer, the second exposed area of the second electrode layer, and the bottom surface of the insulation layer are appeared as viewing from the bottom of the flip chip LED die; and wherein the second electrode layer, and the insulation layer, the protection film on each of the first type doped layer and the first electrode layer are appeared as viewing from a first side vertical to the top surface of the flip chip LED die, and the protection film on each of the first type doped layer, the second type doped layer and the second electrode layer is appeared as viewing from a second side opposite to the first surface of the flip chip LED die.

3. The flip chip LED die as claimed in claim 1 or 2, wherein each of the first exposed area and the second exposed area is of at least 10000 $\mu m^2$, and the electrically conductive adhesive is solder paste.

4. The flip chip LED die as claimed in claim 1 or 2, further comprising:

a metal reflection layer disposed between the second type doped layer and the second electrode layer.

5. The flip chip LED die as claimed in claim 4, further comprising:

a Bragg reflector structure disposed between the metal reflection layer and the second type doped layer.

6. The flip chip LED die as claimed in claim 1 or 2, further comprising:

a transparent coating layer disposed on the top surface of the first type doped layer.

7. The flip chip LED die as claimed in claim 6, further comprising:

a coarsened structure disposed on an outer surface of the transparent coating layer.

8. The flip chip LED die as claimed in claim 6, further comprising:

a coarsened structure disposed on a side surface of the transparent coating layer.

9. The flip chip LED die as claimed in claim 6, wherein the transparent coating layer is a patterned sapphire substrate.

10. The flip chip LED die as claimed in claim 1 or 2, wherein each of the first exposed area and the second exposed area is of at least 625 $\mu m^2$, and the electrically conductive adhesive is silver glue.

* * * * *